United States Patent [19]

Chia

[11] Patent Number: 4,688,152
[45] Date of Patent: Aug. 18, 1987

[54] MOLDED PIN GRID ARRAY PACKAGE GPT
[75] Inventor: Chok J. Chia, Santa Clara, Calif.
[73] Assignee: National Semiconductor Corporation, Santa Clara, Calif.
[21] Appl. No.: 895,395
[22] Filed: Aug. 11, 1986
[51] Int. Cl.[4] .............................................. H05K 7/06
[52] U.S. Cl. .............................. 361/408; 264/272.17; 29/588; 174/52 PE
[58] Field of Search ...................... 264/272.17; 29/588; 174/52 PE, 52 FP; 357/70, 72, 73; 361/395, 401, 403, 408, 397, 400

[56] References Cited

U.S. PATENT DOCUMENTS

| | | | |
|---|---|---|---|
| 3,701,451 | 10/1972 | Schindler | 174/53 |
| 4,100,566 | 7/1978 | Okikawa | 29/588 |
| 4,460,537 | 7/1984 | Heinle | 29/588 |
| 4,631,805 | 12/1986 | Olsen | 29/588 |

Primary Examiner—G. P. Tolin
Attorney, Agent, or Firm—Gail W. Woodward

[57] ABSTRACT

A pin-grid package is created by starting with printed wiring boards that have plated through holes that can accommodate wire pins. Pins are secured in position to extend outward from one face of the PW board in the form of a pin grid array of the desired configuration which is typically a plurality of concentric rings thereby creating a square grid pattern of predetermined spacing. The opposing PW board face includes a central pin-free area to which is secured a semiconductor die. This face of the PW board includes a plurality of wiring traces that connect each pin to an array that surrounds the semiconductor die. The traces are connected to the bonding pads of the semiconductor die by either wire bonds or a spider assembly using tape assembly bonding. The PW board is located in a mold that has a flat faced first platen that contains cut-out regions that will accommodate the package pins. The other flat-faced mold platen contains molding cavities that are in registry with and slightly larger than the PW boards. The mold cavities include a series of ribs that are distributed around the cavity periphery. These ribs bear against the PW board when the mold is assembled so that the PW board is centered and pressed against the flat face of first platen in the region outboard of the pin-grid pattern. When a liquified plastic encapsulant is forced into the mold the cavities will be filled and the liquid will be excluded from the pin side of the PW board.

3 Claims, 6 Drawing Figures

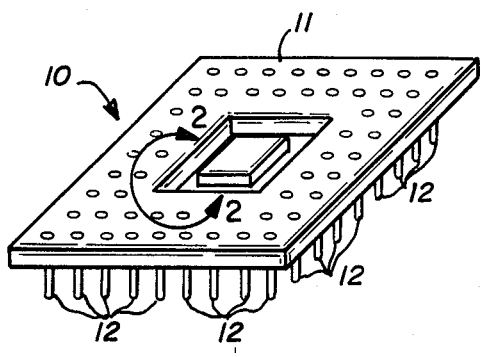
Fig_1 PRIOR ART
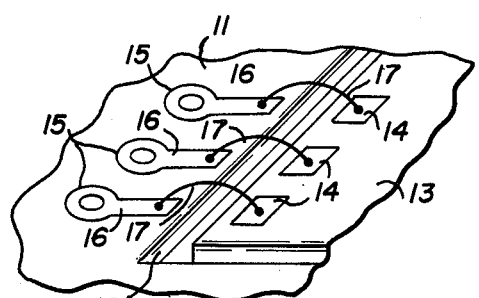
Fig_2 PRIOR ART
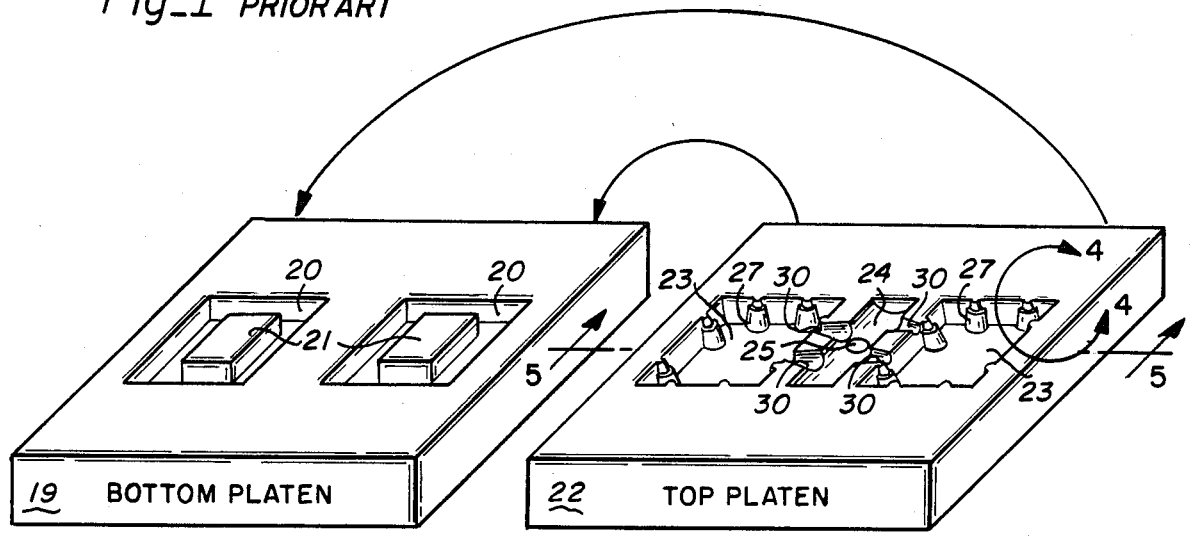
Fig_3
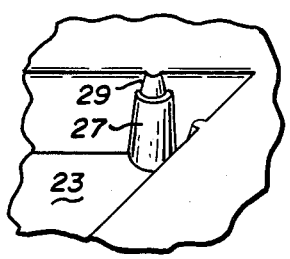
Fig_4
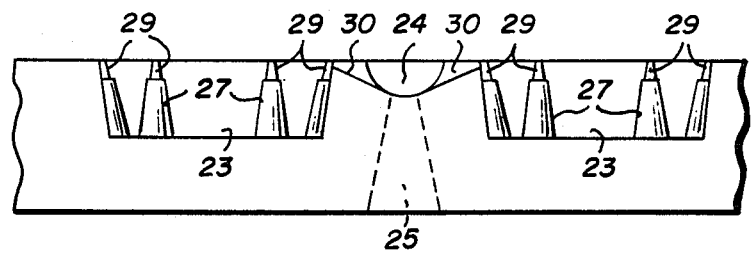
Fig_5
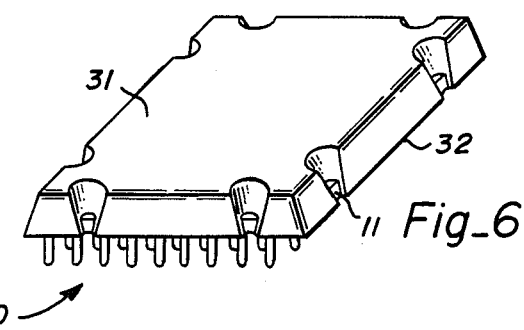
Fig_6

MOLDED PIN GRID ARRAY PACKAGE GPT

BACKGROUND OF THE INVENTION

The pin-grid array has become a popular form of integrated circuit (IC) package because it provides for a large number of pins to be associated with a plug-in package. Basically, an array of pins having a standard spacing (for example, 100 mils) is located on a printed wiring (PW) board so that they extend outward from one face for joining with the metal traces on a mother board. The pit array surrounds a central open area that houses an IC chip. The pins are contacted by metal traces on the PW board that terminate in an array that fronts on the central open area. If desired, the central area of the PW board can have a recess that is deep enough to accommodate the IC chip so that the chip bonding pads are on the same level as the array of metal traces. The IC chip is bonded in the recess and wire bonds are made between the bonding pads and the traces. Then the IC chip and its leads are covered with an encapsulant that completes the package. Alternatively, the chip pad to PW board connections can be made using a tape automated bonding (TAB) spider.

Two basic encapsulation methods have been used. In the first, a blob of plastic is cast upon the IC chip so as to cover it and the bond wires. In the second method a metal shell or lid is formed to have a skirt slightly larger than the PW board and a central raised portion that accommodates the IC chip and bond wires. This lid covers a sealing compound that fills the space inside the lid and cements it to the PW board.

Transfer molded plastic housings for IC devices have been developed to a high degree. They are mechanically stable, strong, chemically stable and, in general, compatible with IC's and their bond wires. A suitable plastic composition and the transfer molding conditions are set forth in Sporck U.S. Pat. No. 3,838,094 which is assigned to the assignee of the present invention. The teaching in this patent is incorporated herein by reference. In transfer molding the device to be encapsulated is located inside a metal mold which has recesses that define the shape of the housing to be produced. Plastic, that is ordinarily a solid, is heated and forced through gates into the mold under pressure. The heat and pressure causes it to liquify and flow into the mold cavities. The mold is heated to thermoset the plastic which thereby surrounds the IC and provides a mechanical support for the semiconductor device. The assembly can then be removed from the mold. Then the assembly can be heated to fully cure the plastic which becomes quite stable and assumes a chemical form that has the desired properties.

The basic characteristics of transfer molding are taught in U.S. Pat. No. 4,460,537 to Preston J. Heinle. The various terms used in such encapsulation are defined and the related processes detailed. The teaching in this patent is incorporated herein by reference.

It would be desirable to employ transfer molding to encapsulate an IC device located on pin-grid array using a plastic that has the desired properties.

SUMMARY OF THE INVENTION

It is an object of the invention to employ transfer molding to encapsulate a pin-grid array that contains an IC mounted thereon.

It is a further object of the invention to provide a transfer mold that can contain a plurality of pin-grid array boards and provide transfer molded encapsulations for the boards without contaminating the pin side of the boards with plastic.

These and other objects are achieved as follows. A transfer mold is formed in two halves that, when brought together, form a plurality of cavities, each one of which can form an encapsulated pin-grid array. One half of the mold includes recesses that can accommodate the pins of a pin-grid array and yet press against the pin-grid array central portion and the periphery of the PW board. The other half of the mold contains a series of cavities that are slightly larger than the PW boards and are coupled to mold gates which can allow the entry of heated, pressurized plastic. The cavities include a series of clamping ribs arrayed around the periphery of each cavity. When the mold halves are closed the clamping ribs center the PW board in the cavity and press the PW boards against the facing mold surfaces. Then, when the plastic is forced into the cavities, by way of the gates, it can be molded over the face of the PW board so as to cover it and thereby encapsulate the IC and connecting wires. The clamping ribs hold the PW board in place during molding and leave notches in the final plastic encapsulant.

BRIEF DESCRIPTION OF THE DRAWING

FIG. 1 is a front elevation view of a prior art pin-grid housing board prior to encapsulation.

FIG. 2 is an enlarged view of a portion of the FIG. 1 showing to illustrate how the printing wiring traces are bonded to the IC chip.

FIG. 3 shows the upper and lower platens that comprise a two-cavity transfer mold that employs the invention.

FIG. 4 is an enlarged view of one of the cavity ribs.

FIG. 5 is a cross-section of the platen of FIG. 3 taken at line 5.

FIG. 6 is a front elevation view of a device molded in the cavity of the FIG. 3 mold.

DESCRIPTION OF THE PRIOR ART

FIG. 1 shows a typical pin-grid package 10 prior to encapsulation. A substrate 11 is a conventional multi-layer printed wiring board having an array of pins 12 soldered into plated-through holes established in the conventional manner. These pins are arrayed in concentric rings located on substrate 11 so as to locate them on a regular grid pattern. One standard packages locates the pins on 100-mil centers. This package has 124 pins which can be accommodated in a configuration 1.31 inches square having three concentric pin rings. Other configurations are available.

FIG. 2 is an enlarged segment of FIG. 1 showing a portion of the central region of PW board 11 which is designed to accommodate an IC chip. Board 11 has a central well 18 that extends part way through the PW board. AN IC chip 13 is secured to the bottom of the well as by cementing or other means of physical attachment (not shown). It is preferred that well 18 is made deep enough so that the upper surface of chip 13 is in the same plane as the surface of the PW board. Chip 13 has the conventional array of bonding pads 14 located at its periphery. While only three are illustrated, it is to be understood that a large number (for example, as many as 124) can be present.

Rings 15 represent the soldered-in ends of pins 12 and they are actually topside portions of the plated through holes in PW board 11. Each pin located in board 11 will include a metal trace 16. The traces 16 terminate in an array that surrounds the edge of well 18. While not shown, it is to be understood that each of the pins located on PW board 11 has a trace that makes it available in the array surrounding well 18.

After IC chip 13 has been secured to the bottom of well 18, the IC bonding pads 14 are provided with wire bonds 17 that electrically join the package pins with the IC chip. Alternatively, these connections can be accomplished using the spider in a TAB approach.

In the conventional pin-grid array processing, a blob of plastic encapsulant (not shown) is applied to the upper surface of PW board 11 so as to cover and protect the IC 13 and the wire bonds 17. Alternatively, a loose-fitting metal cover can be applied to cover the upper surface of PW board 11 and the space between 14 and the PW board filled with an injection of plastic encapsulant.

DESCRIPTION OF THE INVENTION

FIG. 3 shows a two-cavity transfer mold in which pin grid arrays can be encapsulated. While the mold shown has only two cavities, for clarity, a conventional mold can have as many as desired. Typically, a 36-cavity mold will be employed.

The bottom mold plate 19 has a pair of ring-shaped cut-outs 20. The outer periphery of the cut-outs 20 is made slightly larger than the outline of pins 12 and slightly smaller than the outer edges of PW board 11. Thus, the outer edge of cut-outs 20 will engage the periphery of the PW board on the pin face. The central portion of PW board 11, opposite chip 13, rests upon post 21 so as to resist board deflection. The cut-outs 20 are deep enough to fully accommodate the pins of the pin-grid array.

The top-mold platen 22, which inverts and associates with bottom plate 19 as indicated by the arrows, includes cavities 23, which will serve the package mold. Cut out 24 acts as the transfer-mold runner. The cavities 23 are made slightly larger than the PW board 11 dimensions so that after molding the plastic package material will form a lip covering the periphery of PW board 11. Hole 25 extends from runner 24 to the opposing face of platen 22 to provide an ingress for the encapsulating plastic. While not illustrated, it is to be understood that platens 19 and 22 include guide-pin holes for accurate alignment thereof and platen 22 will also include extractor pins and holes therefor which are used to eject the parts from the mold after molding is completed.

Cavities 23 include a series of peripheral ribs 27 which, after the mold platens are closed, engage peripheral joints along the edge of PW board 11 and press it in place during molding. As pointed out above, cavities 23 are made slightly larger than PW board 11 and ribs 27 extend inwardly sufficiently to engage the edges of the PW board. FIG. 4 shows the rib 27 detail. Each rib is made up of two parts including a tapered main portion 28 and a smaller tapered extension 29. The tapered main portion 28 forms a shelf that is wide enough to engage the edge of PW board 11 when the mold is closed. The spacing between opposing faces of extensions 29 is established to provide a snug fit for opposing edges of PW board 11. Thus, when a board is inserted into the mold it is centered within the cavity. The length of sections 29 is made slightly less than the thickness of PW board 11. When the mold is closed with a PW board therein the faces of rib portions 28 will press against spaced points along the PW board and force the face containing the pins against platen 19. Sufficient mold closure pressure is exerted to ensure that the subsequently transferred encapsulant is confined to within the mold cavity.

It will be noted that ribs 27 are tapered and the peripheral faces of cavities 23 are sloped. This ensures that the molded devices will not be keyed inside the mold and can easily be removed therefrom after molding.

FIG. 5 is a cross-section of platen 22 taken through a region that intersects a pair of opposing gates 30 that communicate with the mold cavities 23. Runner 24 has a relatively large cross-section and communicates with hole 25 which extends through the platen. Hole 25 will be coupled to a source of fluid plastic contained in a conventional transfer molding machine, not shown. Gates 30 are tapered so as to have a relatively small cross-section where they join the molding cavities.

In operation a charge of unreacted molding compound is ground to a powder and placed in the molding machine heater chamber. The compound is then heated to fluidize it and a transfer ram forces the fluid into platen hole 30, along runner 24 and finally along gates 30 into cavities 23. The mold is heated in the molding machine to a temperature that will cause the molding compound to react and at least partially cure. If desired, complete curing can take place within the mold, but, since this may take a relatively long time, the partially cured product is ordinarily removed from the mold which can then be reused for the next molding operation. The partially cured product is then placed in an oven and fully cured.

The molded product will include the encapsulated pin grid arrays and the material that was used to fill runner 24 and gates 30. The molded arrays are broken away from the plastic at the narrowest point which is where the gate material joins the encapsulated product.

The encapsulated product then appears as is shown in FIG. 6. The original PW board is covered with a molded plastic housing 31 which has a series of edge indentations caused by ribs 27 in the molding platen. The plastic material covers and seals the top surface of the PW board and also forms a skirt 32 surrounding its edge. The plastic terminates at the plane of the pin side of the PW board.

It can be seen that wiring side of PW board is fully covered and sealed by encapsulant material. The IC chip and the connecting wires are covered and protected by encapsulant.

The invention has been described in sufficient detail that it can be practiced by a person of ordinary skill in the art. When such a person reads the foregoing description, alternatives and equivalents, within the spirit and intent of the invention, will be apparent. Accordingly, it is intended that the scope of the invention be limited only by the following claims.

I claim:

1. A molded pin grid array package comprising:
    a printed circuit wiring board having plated through holes including a plurality of package pins secured therein and extending from a first face to form a pin grid array;
    said printed wiring board having a second face which carries a printed wiring pattern and a centrally mounted semiconductor die, said printed wiring including an array of traces having tips that form a pattern that surrounds the periphery of said die;

means electrically connecting said pattern that surrounds said die to the bonding pads on said die; and a molded plastic encapsulant surrounding said second face of said printed wiring board, said molded plastic encapsulant including a series of indentations around its peripheral edge, whereby said printed wiring board along with said semiconductor die and said electrical connecting means are encapsulated in a molded package.

2. The molded pin grid array package of claim 1 whereby said molded encapsulant further surrounds the edge of said printed wiring board to form a skirt that terminates in the plane of said first face.

3. The molded pin grid array package of claim 2 wherein said indentations include a tapered portion extending from said first face of said printed wiring board to the outer face of said package.

* * * * *